United States Patent [19]

Hopfer

[11] 4,207,518
[45] Jun. 10, 1980

[54] BROADBAND RADIATION DETECTOR WITH DIODE ELEMENTS

[75] Inventor: Samuel Hopfer, Brooklyn, N.Y.

[73] Assignee: General Microwave Corporation, Farmingdale, N.Y.

[21] Appl. No.: 883,632

[22] Filed: Mar. 6, 1978

[51] Int. Cl.$^2$ .................... G01R 21/10; G01R 19/22
[52] U.S. Cl. .................... 324/95; 324/72.5; 324/119; 343/703
[58] Field of Search ........... 324/95, 106, 72.5, 119; 343/703, 701, 802; 325/67; 333/33; 340/600

[56] References Cited

U.S. PATENT DOCUMENTS

| | | | |
|---|---|---|---|
| 2,106,768 | 2/1938 | Southworth | 333/33 |
| 2,131,101 | 9/1938 | Ferris | 333/81 R |
| 2,808,566 | 10/1957 | Douma | 324/95 |
| 3,384,819 | 5/1968 | Rinkel | 324/95 |
| 3,750,017 | 7/1973 | Bowman et al. | 324/72 |
| 3,794,914 | 2/1974 | Aslan | 324/95 |
| 3,931,573 | 1/1976 | Hopfer | 324/95 |
| 4,008,477 | 2/1977 | Babij et al. | 343/701 |

OTHER PUBLICATIONS

Hopfer, S.; "Design of Broadband ...", IEEE Trans. on Instruments and Measurements, vol. IM-21, Nov. 1972, pp. 416-421.
Greene, F. M., "New Near-Zone ...", NBS J. of Research, vol. 71-C, Jan.-Mar. 1967, pp. 51-57.
Rudge et al., "Near Field Instrumentation", BRH-DEP 70-16, Jul. 1970.
Hopfer, S., "The Properties of Thermo-Electric ...", IRE Int. Conv. Rec., pt. 3, 1962, pp. 77-84.
Wacker et al., "Quantifying Hazardous ...", IEEE Trans. on Microwave Theory & Tech., Feb. 1971, pp. 178-187.
Rudge, A.W., "An Electromagnetic Radiation Probe ..", J. of Microwave Power, 5(3), 1970, pp. 155-174.
Terman, F. E., "Electronic and Radio Engineering", McGraw-Hill Book Co. Inc., New York, N.Y., 1955, pp. 50-57.

*Primary Examiner*—Ernest F. Karlsen
*Attorney, Agent, or Firm*—Morton C. Jacobs

[57] ABSTRACT

A radiation detector for free space microwave radiation uses thin film resistive strips, having an equivalent surface resistivity that is large compared to the characteristic impedance of free space, and diode circuits in series with the strips for deriving signals monitoring the radiation intensity over a broad frequency range. The diode circuits are constructed to operate with a uniform response over that frequency range.

28 Claims, 6 Drawing Figures

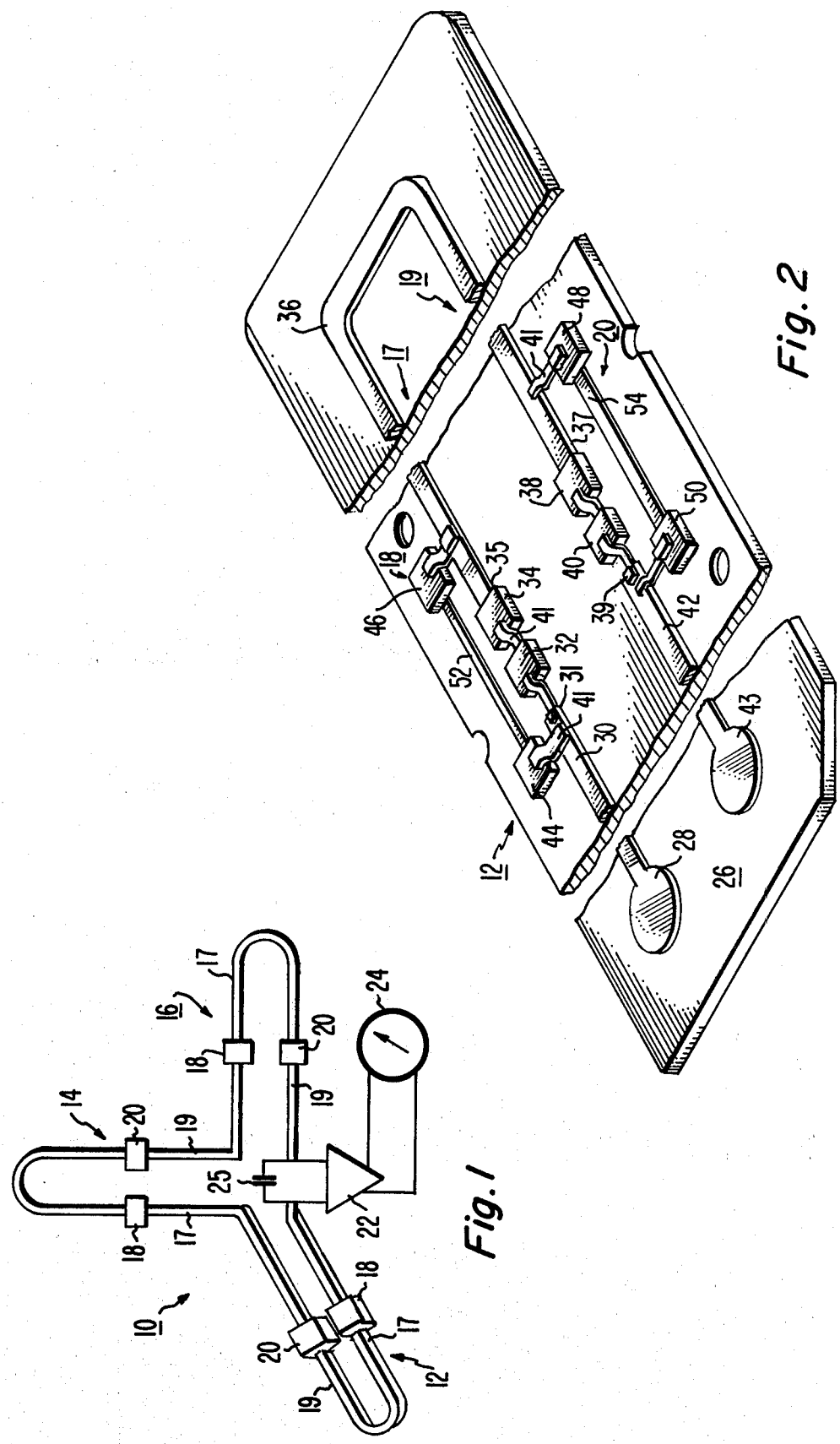

BROADBAND RADIATION DETECTOR WITH DIODE ELEMENTS

BACKGROUND OF THE INVENTION

This invention relates to radiation detection devices for electromagnetic radiation, and particularly to such devices which are useful for a broadband of radio frequencies.

Described in applicant's paper "Design of Broad-Band Resistive Radiation Probes," IEEE Tr. Instr. and Meas. Nov. 1972, Vol IM-21, No. 4, pp. 416–421 and in his earlier patent U.S. Pat. No. 3,931,573 which are here incorporated by reference, is a detector for free-space radiation over a broadband of radio frequencies in the microwave spectrum. Such a detector is desirably achieved by an arrangement of resistive strips for extracting and absorbing radiant energy from the freespace field rather than by an antenna. The resistive strips keep the effects of reflection and diffraction to a minimum, and the resistive strip arrangement has sufficient transparency so as not to disturb the field being measured and detected. As explained in those prior references, the ohmic resistance of the strips is large compared to the radiation resistance over the operating frequence range. Consequently, the fractional absorption of the radiant energy by the resistive strips is substantially invariant with frequency, and an ultra broadband radiation detecting device is thereby produced. Thus, unlike an antenna, which uses metallic surfaces of negligible resistance, the resistive strip arrangement does not disturb the near field being measured. Applicant's aforementioned paper and patent describe a specific embodiment using thermocouples for converting the absorbed r-f emergy to a d-c measurement signal.

Other radiation detectors use antennas (i.e., transducers having conventional highly conductive surfaces). These detectors tend to produce disturbance in the field being measured due to the conductive materials, and to be narrow band by reason of the frequency sensitivity of the antenna. However, by using a "short" dipole antenna (i.e., a small fraction of a wavelength at the high frequency end of the band), and with a high reactance relative to the free space impedance, somewhat broader bands have been achieved; see "New Near-Zone Electric-Field-Strength Meter" by F. M. Greene, NBS J. of Research—C. Eng. and Instr., Vol. 71C, No. 1, Jan.—Mar. 1967, pp. 51–57; "Near Field Instrumentation," report of A. W. Rudge, et al, July 1970, Bureau of Radiological Health of U.S. Dept. H.E.W.; and U.S. Pat. No. 3,750,017 of Bowman, et al. These detectors use diodes for converting the r-f currents induced in the antennas to a d-c measurement signal, which have the advantage of higher sensitivity. Practical constraints may limit such detectors to frequencies up to a few gigaHerz.

SUMMARY OF THE INVENTION

It is among the objects of this invention to provide a new and improved radiation detector for free-space radiation.

Another object is to provide a new and improved detector for free-space radiation which is effective over a broadband of radio frequencies.

Another object is to provide a new and improved free-space radiation detector which has a high degree of sensitivity.

In one form of the invention, a radiation detection device uses thin resistive films arranged as strips for absorbing the electromagnetic radiation in free space. The equivalent surface resistivity of the films is high relative to the free-space impedance so as to avoid any adverse effect on the field being detected. At certain places in the strips, circuits are connected to convert the r-f currents induced in those strips to a corresponding d-c voltage; a barrier device is used for this purpose. The d-c voltage serves as a field measurement signal, which is supplied to a measuring device for monitoring the characteristics of free-space fields.

In one form of the invention, the resistance of the film strip is large compared to the series impedance of the barrier device to avoid any effects of impedance variation in the barrier device with frequency. A low resistance network is connected as an r-f bypass to the barrier device so as to avoid any shunting capacitive effects of the barrier device that are frequency variant.

BRIEF DESCRIPTION OF THE DRAWINGS

The foregoing and other objects of this invention, the various features thereof, as well as the invention itself, will be more fully understood from the following description, when read together with the accompanying drawing in which:

FIG. 1 is a schematic and perspective view of a radiation detector embodying this invention;

FIG. 2 is an enlarged perspective view with parts cut away of one loop of the detector of FIG. 1;

DESCRIPTION OF A PREFERRED EMBODIMENT

Figure 3:
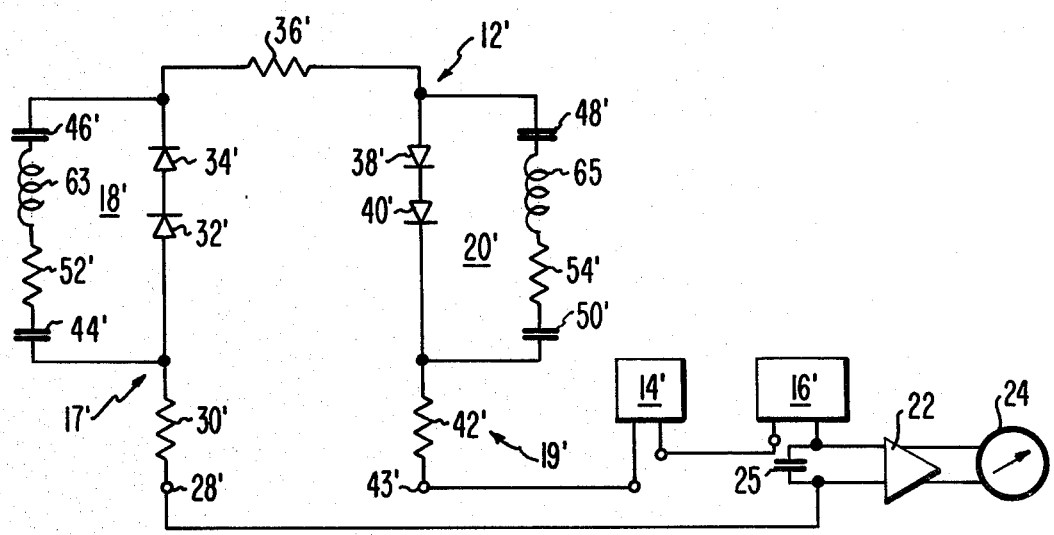
FIG. 3 is an equivalent circuit of the loop of FIG. 2 connected in the detector of FIG. 1.

In the drawing corresponding parts are referenced throughout by similar numerals.

As shown in FIG. 1, an isotropic detector 10 for free-space radiation embodying this invention may include three loops 12, 14 and 16. These loops are respectively oriented along three transverse axes to detect individually the free-space radiation components along those axes, and by combined action to detect the resultant radiation in any direction, in a manner well known to those skilled in art.

The loops 12, 14, and 16 are each formed with two legs 17 and 19 of resistive strips. Connected in each of the two legs 17 and 19, respectively, of each loop 12, 14, 16 are similar r-f to d-c converting circuits 18 and 20, which use a diode or other barrier device. The three loops are connected through an amplifier 22 to a d-c circuit, which circuit is connected through an amplifier 22 to a d-c meter 24. All connecting elements that may effect the radiation field being detected (e.g., those to amplifier 22) are preferably formed of highly resistive material to avoid disturbing that field, and any conductive connectors (used, for example, where contacts are formed) are made very small dimensionally compared to the wavelength at the highest frequency in the frequency range being measured, in a manner well known to those skilled in the art. A capacitive coupling 25 serves as a bypass for r-f currents flowing through the three series loops.

In one form of the invention, the loops 12, 14, 16 are each constructed in a manner shown for loop 12 in FIG. 2. The loop 12 consists of thin-film resistive strips 30, 36 and 42 formed as a film deposition on a substrate 26 such as Kapton, and extending from a small metalized deposition terminal 28 at an outer end of strip 30 to a similar terminal 43 at an outer end of strip 42. For simplicity of illustration, the strips 30, 36 and 42 are only shown at their ends, and the larger intermediate parts are removed.

Diodes 32 and 34 are connected in series between an inner end 31 of that strip 30 and an end 35 of the strip 36, which has a U-shaped configuration for conveniently connecting legs 17 and 19. The other end 37 of strip 36 in turn is connected via two diodes 38 and 40 in series to an inner end 39 of the strip 42, at the outer end of which is terminal 43, which completes the entire loop 12, viewed as a d-c network. Gold ribbons 41 of small dimension are effective for the connections between parts. The four diodes 32, 34, 38 and 40 are connected in series-aiding relation in the loop 12. The thicknesses of the resistive films 30, 36 and 42 are small compared to skin depth at the highest operating frequency to ensure broadband operations as explained in the applicant's paper "The Properties of Thermo-Electric Elements as Microwave Power Detectors," 1962 IRE Int. Conv. Rec. pt. 3, pp. 77-84, and the term "thin film" is used herein to describe that construction.

Also respectively connected to the ends 31 and 35 of the strips 30 and 36 in leg 17 (e.g., by short gold ribbons 41) are terminals of two chip capacitors 44 and 46. Connected between the opposite terminals of chip capacitors 44 and 46 in leg 17 is a resistive strip 52. In a similar fashion, terminals of two chip capacitors 48 and 50 are respectively connected to the strip ends 37 and 39 in leg 19, and a resistive strip 54 is connected between the opposite terminals of those capacitors 48 and 50. Shown in FIG. 3 is an idealized equivalent circuit of the film circuit construction of FIG. 2 for loop 12; corresponding parts are referenced by similar numerals with the addition of a prime (').

The strip 30 and the portion of strip 36 in leg 17 are aligned to form an overall resistive strip for that leg 17, and the associated diodes are serially connected in an intermediate portion thereof. Similarly, the portion of strip 36 in leg 19 and strip 42 are aligned to form an overall strip for leg 19, parallel to that of leg 17, and the associated diodes are similarly connected. The substrates 26 for the three loops 12, 14, 16 may be assembled in any suitable fashion, so that the respective legs 17, 19 for each loop are oriented along the axis in space associated with that loop as shown in FIG. 1. Suitable keying surfaces on the edges or other substrate surfaces may be used for that purpose in a well-known manner. The legs 17 and 19 are closely spaced so that the interconnecting web of strip 36 is small in length and of generally negligible effect, and the area encompassed by the three loops is small to minimize coupling to the H-field. Interconnections between the terminals 28, 43 of adjacent loops may be made with gold ribbons if sufficiently short, or with resistive strips.

Figure 4:
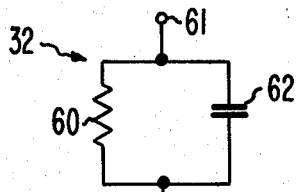
FIG. 4 is an equivalent circuit of a diode in the circuit of FIG. 3.

The diodes 32, 34, 38, 40 are preferably Schottky diodes of the low barrier type with a metal semiconductor junction. Each of these diodes (as shown in the equivalent diagram of FIG. 4) operates with a series resistance 60 and a small shunt capacitance 62 between the diode terminals 61, 63 (e.g., a barrier capacitance of less than 0.1 picofarad and a resistance of about 2000 ohms). The Schottky device is characterized by very rapid response and no storage effects. The d-c component in the diode, due to its non-linear resistive characteristic, varies with the r-f current; this effect is an instantaneous one and is not frequency dependent. Each diode has a reactance due to the barrier capacitance of the order of 100 ohms at the high end of an operating frequency range such as 300 megaHerz to 20 gigaHerz. The example of two diodes in series produces a corresponding series capacitance, which has a combined reactance for the two diodes of about 200 ohms at the high end of that frequency range, which reactance is in shunt with the combined diode resistance.

Figure 6:
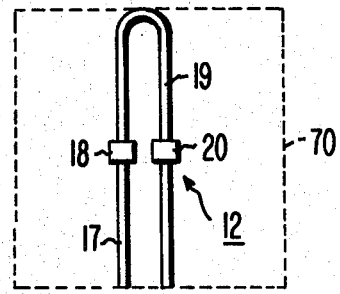
FIG. 6 is an idealized geometrical diagram illustrating the relation of the detector loop of FIG. 2 to a unit square in free space.

Each leg 17, 19 of the loop, illustratively, may have an overall surface resistance of the order of 8000 ohms, by suitably constructing the strips 30 and 36, and 42 and 36 in the two legs, respectively. For example, the strips may be one-inch long and about eight milli-inches (mils) wide to provide about 120 squares of such a strip out of a resistive material such as nichrome film deposition having a suitable resistance of about 70 ohms per square. The two legs 17, 19 are essentially in parallel from the standpoint of the r-f field of the free space radiation in which they are immersed, so that they have an equivalent surface resistance to the associated component of free-space radiation of about 4 kilohms. The equivalent surface resistivity is that for the unit square 70 (FIG. 6), whose side is the length of a leg 17, 19, and corresponds to the distribution of the strip resistance over that square. A high equivalent surface resistivity for unit square 70 is achieved where the width of each resistive strip is less than the width (i.e. the side) of the unit square 70; that is, where the surface area of each strip is less than the area of space between strips. With such spaced strips, the desired overall ohms-per-square characteristic is achieved.

In operation, when the radiation detector of FIG. 1 is positioned in free space, each loop responds to the component of radiation extending along the loop's axis. The radiation component along leg 17 (for example, as shown in FIG. 2) induces an r-f current in the resistive strip made up of a strip portion 30 and the portion 36 in leg 17. As determined by the non-linear characteristic of the diodes 32, 34, which have different resistance characteristics for the oppositely directed r-f current components, a net d-c voltage is developed across those diodes. Similarly, in parallel leg 19 a net d-c voltage is developed across diodes 38, 40, proportional to the similar r-f currents induced in the strip portions 36, 42. This d-c voltage from each leg is cumulative, so that appearing across the terminals 28, 43 of loop 12 is a d-c voltage generally proportional to the intensity of the component of radiation along the axis of legs 17 and 19. Moreover, because of the resistive character of the strips 30, 36, 42 the r-f currents correspond to the entire range of frequencies of microwave radiation applied to the detector. The operation of loops 14 and 16 is similar, and because the diodes of those loops are in series-aiding fashion with the diodes of loop 12, the combined d-c voltage is cumulatively proportional to the overall free space radiation for all directions, and this voltage is supplied to the amplifier 22, which drives the meter 24 for display of the measured value. The amplifier 22 may employ a compensating network to ensure the appropriate proportionality of the measurement to the intensity of radiation, i.e. to transpose the linear d.c. conversion of the diode to a corresponding square-law measurement, in a manner well diode to a corresponding square-law measurement, in a manner well known to the art.

The Schottky diodes illustratively are each about 20 mils square and 7 mils thick, and they take up a small space in the gap between terminals 31 and 35 in each leg. Being connected in series-aiding relation, the diodes have a continuous d-c conduction in their forward direction. The bypass resistive strips 52 and 54 are each about 40 or 50 mils long; and each may be a strip somewhat wider than the strips 30, 36 and 42 to establish the appropriate resistance, which is substantially less than the combined series impedance of the diodes 32 and 34, as explained below; e.g., about 100–200 ohms. The shunt capacitance of the chip capacitors 44 and 46 is very large so that they are effectively a short circuit for the induced r-f currents over the entire frequency range to be measured (illustratively these capacitors may be about 25 mils square and 5 mils thick). The metallic elements of the diodes and chip capacitors are very small compared to the wavelength (e.g., several hundred mils at 20 gigaHerz) at the high frequency end of the operating range.

Figure 5:
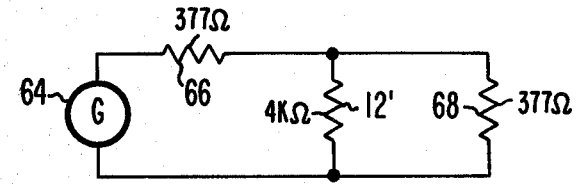
FIG. 5 is an equivalent circuit of the detector loop of FIG. 2 in its relation to radiation in free space.

The free space conditions for a source of electromagnetic radiation may be represented as shown in the equivalent diagram of FIG. 5. The generator 64 represents the r-f source of internal resistance 66, which is the characteristic impedance of free space, namely, 377 ohms. The free space is also represented as a load resistance 68 with the characteristic impedance of 377 ohms. Each loop 12' of the resistive screen of this invention is in shunt with the load 68, and the resistance of the loop 12' is very high (e.g., about 4 kilohms for two parallel 8-kilohm legs) compared to the characteristic impedance of free space. Thereby, the insertion of the loop 12' in the field doesn't disturb or otherwise adversely affect the field being monitored and measured.

The impedance of network 44, 52 and 46 that shunts the series diodes 32, 34 in leg 17 (and that of the corresponding network 44, 52, 46 of leg 19) does not change with frequency for the frequency range over which the device is to operate. That is, from an r-f standpoint, the impedance of each of these shunt networks in that frequency range is the resistance of strip 52 or 54. The latter is substantially less than the lowest value of reactance of the diode barrier capacitances 62 (FIG. 4) which occurs at the high end of the frequency range. For the illustrative Schottky diode, the reactance at 20 gigaHerz is about 100 ohms for one diode and 200 ohms for two series diodes. The shunt strip's resistance should be about 100–200 ohms for the latter case of two diodes, as explained further hereinafter. Thereby, the r-f voltage developed across that shunt network, and across the shunted diodes 32, 34, is essentially determined by shunt resistances 52, 54, and is only to a minor or negligible degree affected by the shunt capacitances 62 of the diodes (which do vary with frequency). Consequently, that r-f voltage for any value of the radiation field (the voltage applied to the diodes for conversion to a d-c voltage) is substantially frequency invariant for corresponding radiation fields over the entire frequency range. While this shunt network 44, 52, 46 tends to produce some attenuation of the r-f current and thereby lowers the d-c voltage produced by the diodes 32, 34, and thus the sensitivity, a generally flat response over the broad frequency range is attained.

A small amount of series inductance 63 and 65 (FIG. 3) inherent in the strips 52, 54 of the bypass networks tends to match out the diode capacitance 62. Thereby, the effect of this shunt network 44, 52, 46 is somewhat improved so that the d-c voltage supplied to the amplifier 22 and the meter 24 is more uniform over the frequency range to be measured. With this inductive compensation, the shunt resistance of strips 52, 54 can be somewhat larger; e.g., 200 ohms in the two-diode example given above. Thus, the effect of the frequency characteristic of the diode due to its capacitance is avoided by reason of the shunt network, and the r-f signal developed cross that diode is substantially independent of frequency in the operating range of the instrument.

So long as the resistance of the shunt-network strip determines the level of the r-f voltage converted to d-c by the diodes (e.g., where the shunt-resistance is less than the reactance of the barrier capacitance) one or more diodes can be employed. The r-f current is generally not affected adversely by a second diode in each leg 17, 19 of each loop 12, 14, 16 since the r-f current is essentially determined by the relatively large resistance (e.g., 8 kilohms) of the resistive strip in each leg 17 or 19. A second diode advantageously halves the shunt capacitances 62 of the diodes, which doubles the combined reactance of those barrier capacitances, and permits a larger shunt-network resistance 52 or 54, with improved sensitivity. Additional diodes may be similarly advantageous under appropriate conditions.

In summary, the resistive strips 30, 36 and 42, 36 in the parallel legs 17, 19 determine the interaction with the free-space radiation on a frequency independent basis. That is, the strip in each leg has a substantial length, and for that strip length the interaction with the field is constant over the frequency range. The free-space radiation field that is detected has a characteristic impedance much smaller than the equivalent surface resistance of each loop 12, 14, 16 and is not disturbed, or otherwise adversely affected, by those resistive strips. The ohmic resistance of each strip is larger than the radiation resistance of the strip over the frequency range of the radiation. By using a dimensionally small barrier device, such as a diode as the element producing the d-c measurement signal, the r-f field is generally not affected. Though the diode's impedance is frequency sensitive, it is small compared to the series resistance of the strip 30, 36 in the same leg. Therefore, the strip resistance, essentially on a frequency-independent basis, establishes the induced r-f current corresponding to the energy extracted from free space. The shunt-network strips 52 and 54, which are resistive and thus frequency independent establish the r-f voltage applied across diodes 32, 34 and 38, 40, respectively. That is, the portion of the r-f current flowing through the diode capacitance 62 is made relatively small, so that the frequency dependence of each diode's barrier capacitance does not adversely affect the corresponding d-c voltage generated across the diodes.

The barrier device circuits 18, 20 may be variously located in each leg 17, 19, respectively, except at the ends of each leg where the r-f current induced by the radiation field is zero. Since the induced r-f current is substantially constant, except adjacent the ends of each leg, alternative locations may be chosen; however, about the middle of each leg is the preferred location shown in the drawing, which location tends to be representative of the mean current therealong.

The power absorbed by a loop 12 is calculated by considering a unit square 70 (FIG. 6) of the length (e.g. about one inch) of each leg 17, 19 in the loops 12, 14, 16.

This one-inch unit square represents the effective area of a pair of loops 12, 14 positioned in one vertical plane (in the orientation of the detector shown in FIG. 1), or the pair of loops 14, 16 in the other, perpendicular vertical plane, or the pair 12, 14 in the horizontal plane. This unit square 70 corresponds to that described in applicant's aforementioned patent (FIG. 7) and 1972 paper (FIG. 4); that is, the loop's strip has a length a of one inch which is much greater than the strip's width w of light mils. The loop strip has a high resistivity equivalent to the effective surface resistivity of the unit square as if the strip's resistance is spread out over that area. The loop 12 (FIG. 6) is effective to absorb a portion of the incident power density $P_{inc}$ given in mw/cm$^2$; the absorbed power $P_a$ over the corresponding area in square centimeters is $$P_a = a \times 6.25 \times P_{inc},$$

where $a$ is the absorptivity for the pair of loops (e.g. 12 and 14) forming the unit square. For the illustrative effective impedance of a loop 12, 14 of 4 kilohms (FIG. 5) along each side of the unit square 70, the absorptivity may be determined as applicant shows in his aforementioned patent (FIG. 10) or 1972 paper (FIG. 7); $a = 0.1$. Thus $$P_a = 0.1 \times 6.25 \times P_{inc} = 0.625 \, P_{inc}$$

Using the illustrative parameters discussed above, with the resistance of the shunt strip 52 at 200 ohms, or 100 ohms per diode, the effective power absorbed per diode $P_{ad}$ (based on the r-f voltage applied to the diode in one-half the loop, i.e. in one leg, for d-c conversion) is given by $$P_{ad} = \tfrac{1}{2} \times 0.625 \, P_{inc} \times (100/8000)$$

The sensitivity of the Schottky diodes for these parameters is about 1.4 v/mw. Therefore, for a $P_{inc}$ of 1 mw/cm$^2$ in the preceeding, equation, and substituting in the following one, the voltage of four diodes in a two-legged loop is $$V_o = 4 \times P_{ad} \times 1.4 \text{ volts}$$

or about 15,000 microvolts for this example. The corresponding output for a detector using thermocouples of the type described in applicant's aforementioned patent or 1972 article is about 100 microvolts. Therfore, the present invention gives rise to an improvement in sensitivity of 20 db or more.

This invention may be employed in units with loops extending along two axes as well; that is, units constructed with two transverse loops, such as loops 14 and 16 of FIG. 1, or in the strip configuration of applicant's aformentioned patent. This invention may also be used with various types of barrier devices for r-f to d-c conversion. Other modifications within the spirit of the appended claims will be apparent to those skilled in the art.

From the above description, it is seen that applicant has provided a new and improved microwave radiation detector that is effective for measuring free-space radiation over a broadband of radio frequencies. This radiation detector is a high sensitivity device that is effective for measuring free-space radiation over a wide frequency band to monitor lower thresholds.

What is claimed is:
1. A radiation detector for free space microwave radiation having frequencies within a certain range comprising:
a plurality of resistive strips oriented along different axes and each having a resistance that is substantially uniform over said radiation frequency range and larger than the characteristic impedance of free space and having r-f currents induced therein in accordance with particular levels of said free space radiation intensity, said r-f currents for corresponding radiation intensity levels being substantially constant with frequency,
a separate circuit including a barrier layer device having a substantial reactance and connected in series with each of said resistive strips for converting r-f currents induced in the associated strip by free space radiation to corresponding d-c signals, and means for establishing the r-f voltages across said barrier layer device corresponding to particular levels of radiation to be substantially constant with respect to frequency over said radiation frequency range,
and means responsive to said d-c signals for monitoring the free space radiation.
2. A radiation detector as recited in claim 1, wherein said resistance is substantially larger than the series impedance of the associated barrier layer device circuit.
3. A radiation detector as recited in claim 2 wherein said constant means for establishing the n-f voltages of each of said barrier layer device circuits includes means for establishing the series impedance thereof to be substantially uniform over a broad microwave frequency range of radiation.
4. A radiation detector as recited in claim 3, wherein said means for establishing a uniform series impedance includes a network coupled in shunt with said barrier layer device of the associated circuit to pass only said r-f currents.
5. A radiation detector as recited in claim 4, wherein said network coupled in shunt has an impedance substantially less than the series reactance of said barrier layer device over the radiation frequency range.
6. A radiation detector as recited in claim 4, wherein said resistive strips are thin films, and said network coupled in shunt of each of said circuits includes another thin film resistive strip.
7. A radiation detector as recited in claim 6, wherein said network coupled in shunt has an inductive reactance in series with the resistance of the strip thereof.
8. A radiation detector as recited in claim 1, wherein each of said barrier layer device circuits is located between the end of the associated strip.
9. A radiation detector as recited in claim 1, wherein said barrier layer device is located at about the medial portion of the associated strip.
10. A radiation detector as recited in claim 2, wherein said barrier layer device is a diode.
11. A radiation detector as recited in claim 10, wherein each of said barrier layer device circuits includes a plurality of diodes in series with the associated resistive strip and in aiding relation with each other.
12. A radiation detector as recited in claim 9, wherein said resistive strips are thin films, and each of said separate circuits includes another thin film resistive strip capacitively coupled to the associated series resistive strip and in shunt with the associated diode.

13. A radiation detector as recited in claim 12, wherein said another thin film resistive strip has a resistance substantially less than the reactance of the associated diode capacitance.

14. A radiation detector as recited in claim 10, wherein a plurality of said strips are connected in parallel with respect to a certain axis of the free space field, and in a d-c series circuit relation with each other in a loop, and with the said diodes thereof connected in series-aiding relation.

15. A radiation detector as recited in claim 14, wherein a plurality of said loops are located with the strips thereof parallel to respectively transverse axes of the free space field, and with said loops connected in a d-c series circuit relation with each other, and said diodes of said loops connected in series-aiding relation.

16. A radiation detector as recited in claim 14, wherein said means responsive includes means for amplifying the cumulative d-c voltage of said series loops.

17. A radiation detector as recited in claim 1, wherein said barrier layer device is small compared to the wavelength of the radiation at the highest frequency of the range.

18. A radiation detector for free space microwave radiation comprising:
a plurality of thin film resistive strips oriented along different axes and each having a large ohmic resistance compared to the radiation resistance thereof and each having a large total strip resistance compared to the characteristic impedance of free space and having r-f currents induced therein in accordance with particular levels of said free space radiation intensity, said r-f currents for corresponding radiation intensity levels being substantially constant with frequency,
a separate circuit including a diode having a substantial reactance and connected in series with each of said resistive strips for converting r-f currents induced in the associated strip by free space radiation to corresponding d-c signals, and resistive means connected in parallel with said diode for passing said r-f currents and, for establishing said d.c. signals corresponding to particular levels of said r-f currents to be substantially constant with respect to frequency over a range of frequencies of said radiation,
said strips having a large resistance compared to the series impedance of said diode circuit,
and means responsive to said d-c signals for monitoring the free space radiation.

19. A radiation detector for free space microwave radiation comprising:
a plurality of thin film resistive strips oriented along different axes and each having a large ohmic resistance compared to the radiation resistance thereof and each having a large total strip resistance compared to the characteristic impedance of free space and having r-f currents induced therein in accordance with particular levels of said free space radiation intensity, said r-f currents for corresponding radiation intensity levels being substantially constant with frequency,
a separate diode circuit having a substantial reactance and connected in series with each of said resistive strips for converting r-f currents induced in the associated strip by free space radiation to corresponding d-c signals,
each of said diode circuits including a diode and means for maintaining the voltages across said diode corresponding to particular levels of radiation substantially constant with respect to frequency over a range of microwave frequencies of said radiation,
said strips having a large resistance compared to the series impedance of said diode circuit,
and means responsive to said d-c signals for monitoring the free space radiation.

20. A radiation detector for free space microwave radiation having frequencies within a certain range comprising:
a plurality of resistive strips oriented along different axes and each having a resistance that is substantially uniform over said radiation frequency range and larger than the characteristic impedance of free space and having r-f currents induced therein in accordance with particular levels of said free space radiation intensity, said r-f currents for corresponding radiation intensity levels being substantially constant with frequency,
a separate circuit including a diode having a substantial reactance and connected in series with each of said resistive strips for converting r-f currents induced in the associated strip by free space radiation to corresponding d-c signals, and means for establishing the series impedance of said circuit to be substantially constant with respect to frequency over said radiation frequency range,
and means responsive to said d-c signals for monitoring the free space radiation.

21. A radiation detector as recited in claim 20, wherein each of said means for establishing includes means for establishing said circuit series impedance to be substantially uniformly resistive.

22. A radiation detector as recited in claim 21, wherein each of said constant-resistive impedance establishing means includes a thin film resistive network in shunt with the associated diode and having a resistance substantially less than the series reactance of the associated diode.

23. A radiation detector as recited in claim 1, wherein the ohmic resistance of each of said strips is large compared to the radiation resistance thereof.

24. A radiation detector as recited in claim 1, wherein the surface area of each of said resistive strips is less than the area of space between said strips.

25. A radiation detector as recited in claim 10, wherein a plurality of said strips are parallel to respectively transverse axes and connected in a d-c series circuit relation with each other, said diodes associated with said transverse strips being connected in series-aiding relation.

26. A radiation detector as recited in claim 25, wherein each of said strips is parallel to a different one of three transverse axes.

27. A radiation detector for free space microwave radiation having frequencies within a certain range comprising:
a resistive strip having a resistance that is substantially uniform over said radiation frequency range and larger than the characteristic impedance of free space and having r-f currents induced therein in accordance with particular levels of said free space radiation intensity, said r-f currents for corresponding radiation intensity levels being substantially constant with frequency, a circuit including a barrier layer device having a substantial reactance in series with said resistive strip for converting r-f currents induced in said strip by free space radiation to corresponding d-c signals, different r-f voltages appearing across said barrier layer device respectively corresponding to particular levels of radiation, and including means for maintaining each of said voltages substantially constant with respect to frequency over said radiation frequency range, and means responsive to said d-c signals for monitoring the free space radiation.

28. A radiation detector as recited in claim 18, wherein said resistive means includes another thin film resistive strip having a resistance less than that of the reactance of said diode, said diode circuit further including a capacitor coupling said other resistive strip in parallel with said diode.

* * * * *